United States Patent [19]

Yoshihara et al.

[11] Patent Number: 4,644,093
[45] Date of Patent: Feb. 17, 1987

[54] CIRCUIT BOARD

[75] Inventors: Kunio Yoshihara; Toshio Sudo, both of Kawasaki; Atsuko Iida, Tokyo; Takeshi Miyagi, Kawasaki; Tamio Saito; Shigeyuki Oe, both of Tokyo, all of Japan

[73] Assignee: Kabushiki Kaisha Toshiba, Kawasaki, Japan

[21] Appl. No.: 788,571

[22] Filed: Oct. 17, 1985

[30] Foreign Application Priority Data

Dec. 26, 1984 [JP] Japan .................................. 59-273401

[51] Int. Cl.⁴ .............................................. H05K 1/03
[52] U.S. Cl. .................................... 174/36; 333/238; 361/397
[58] Field of Search ...................... 174/36; 333/1, 238; 361/397, 406

[56] References Cited

U.S. PATENT DOCUMENTS

| 3,179,904 | 4/1965 | Paulsen | 174/36 X |
| 3,634,782 | 1/1972 | Marshall | 174/36 X |
| 4,423,282 | 12/1983 | Suzuki et al. | 174/36 |
| 4,441,088 | 4/1984 | Anderson | 174/36 X |
| 4,475,006 | 10/1984 | Olyphants | 174/36 |
| 4,498,122 | 2/1985 | Rainal | 174/36 |

FOREIGN PATENT DOCUMENTS 2097998 11/1982 United Kingdom ................ 361/397

Primary Examiner—P. R. Kucia
Attorney, Agent, or Firm—Oblon, Fisher, Spivak, McClelland & Maier

[57] ABSTRACT

A circuit board comprises a substrate made of a semi-insulating or insulating material, an insulating layer formed on the substrate and having a lower dielectric constant than the dielectric constant of the substrate, and a plurality of wiring conductors formed at predetermined intervals on the insulating layer. The insulating layer has a thickness determined according to the distance between adjacent wiring conductors and equal to 0.5 to 2.5 times the distance noted above, for the purpose of reducing cross-talk noise.

10 Claims, 8 Drawing Figures

F I G. 1
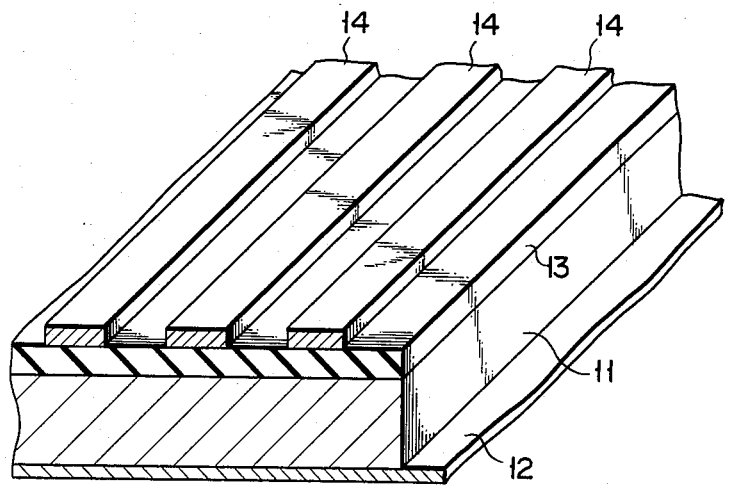
F I G. 2
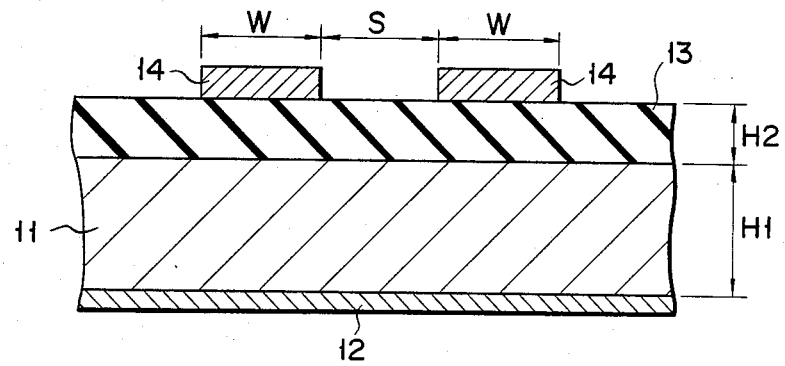

F I G. 5
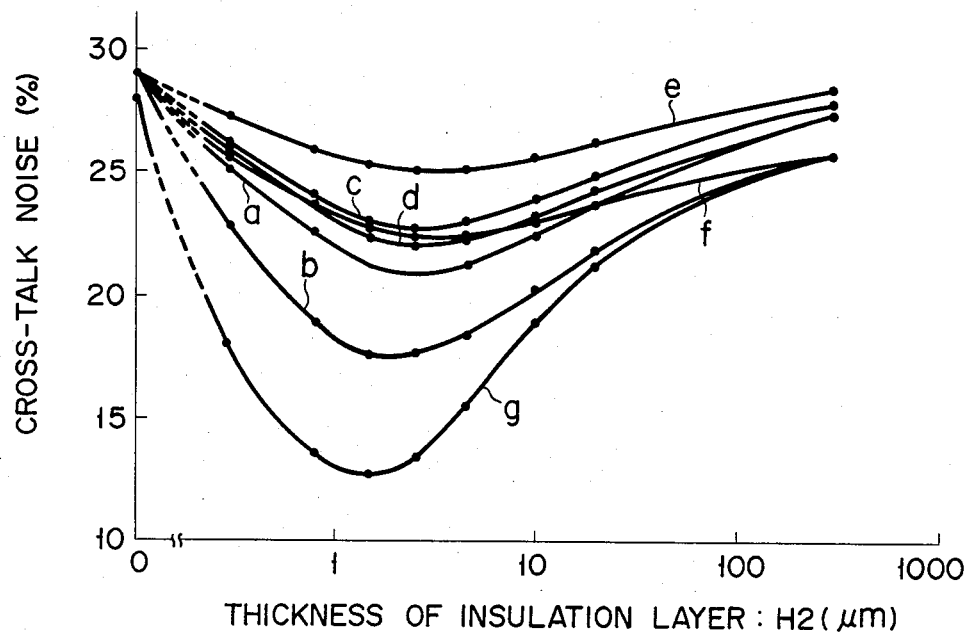
F I G. 6
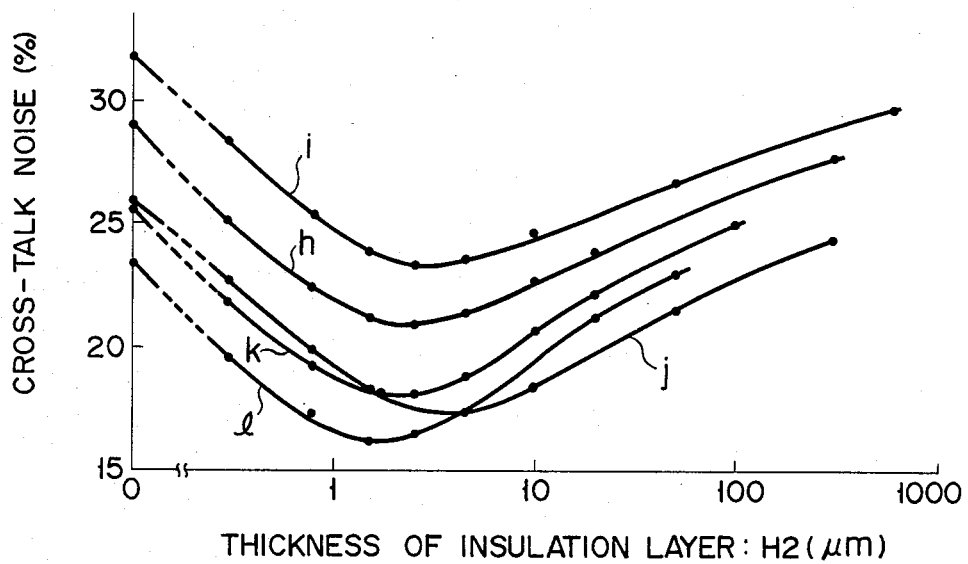

CIRCUIT BOARD

BACKGROUND OF THE INVENTION

This invention relates to a circuit board, and, more particularly, to a circuit board having wiring conductors provided on a semiconductor substrate having a comparatively high dielectric constant.

Where a high speed digital circuit is formed on a semiconductor substrate having a high dielectric constant such as a GaAs IC, wiring conductors are formed on the substrate for the interconnection and connection of these circuits to an external apparatus. Cross-talk noise, however, is produced between such wiring conductors. The cross-talk noise increases with increasing operation speed of the digital circuit, and the cross-talk noise increase presents problems, as discussed in Yoshihara et al, "Numerical Analysis of High Speed Pulse Transfer Characteristics in GaAs ICs", the Institute of Electronics and Communication Engineers of Japan, Research Sample SSD 83-159, (1984) p. 109, as well as in A. Masaki and T. Chiba, "Design Aspects of VLSI for Computer Logic", IEEE, J. Solid-State Circuits, Vol. SC-17, No. 2, (April 1982) pp. 381–386. As is described in this literature, cross-talk noise is pronounced when the inter-wiring capacitance is higher than the capacitance of the wiring conductor on the substrate, with respect to ground. Similar problems arise with a circuit substrate in which high speed digital ICs are provided on an insulating substrate having a high dielectric constant; e.g., alumina ceramics and IC elements interconnected by wiring conductors. In such a circuit substrate, the wiring length is frequently greater than the wiring on the GaAs substrate. Therefore, inter-wiring cross-talk noise occurs when a gentle pulse signal having a transient response is transmitted through the conductor wiring.

SUMMARY OF THE INVENTION

An object of the invention is to provide a circuit board in which inter-wiring cross-talk noise is effectively reduced.

According to the invention, an insulating layer having a low dielectric constant is formed on a substrate having a comparatively high dielectric constant, e.g., made of GaAs or ceramics, and a plurality of wiring conductors are formed on the insulating layer. The thickness of the insulating layer is set in proportion to the distance between adjacent wiring conductors so as to reduce cross-talk noise, and is preferably determined by a value 0.5 to 2.5 times the distance between adjacent wiring conductors.

BRIEF DESCRIPTION OF THE DRAWINGS

FIG. 1 is a perspective view showing an embodiment of the circuit board according to the invention;

FIG. 2 is a sectional view showing the circuit board shown in FIG. 1;

FIG. 5 is a graph showing cross-talk noise levels measured for various dielectric constants of the substrate and insulating layer;

FIG. 6 is a graph showing cross-talk noise levels measured for various values of the sum H1+H2 of the thicknesses of the substrate and insulating layer;

DETAILED DESCRIPTION OF THE PREFERRED EMBODIMENT

Referring now to FIG. 1, there is shown an embodiment of the circuit board according to the invention. A substrate 11 is a semi-insulating substrate, e.g., a GaAs substrate or an insulating substrate (e.g., alumina ceramic ($Al_2O_3$). A ground conductor layer 12 is provided on the back surface of the substrate 11. An insulating layer 13 is formed on the obverse surface of the substrate 11. The insulating layer 12 is made of an insulator having a lower dielectric constant than the dielectric constant of the substrate 11, e.g., $SiO_2$, polyimide, Teflon (a trade name), epoxy resins, etc. A plurality of wiring conductors 14 are formed at predetermined intervals on the insulating layer 13.

Where the substrate 11 is a GaAs substrate, a multichip integrated circuit is fabricated on the substrate 11 by a well-known semiconductor manufacturing process and is connected to the wiring conductors 14, whereby a high speed digital IC device is formed. Where the substrate 11 is an alumina ceramic substrate, an IC chip with a digital circuit is mounted on top of the substrate 11 and connected by means of wire bonding to the wiring conductors, whereby a hybrid IC device is formed.

FIG. 2 shows the thickness H1 of the substrate 11, thickness H2 of the insulating layer 13, width W of the wiring conductors 14, distance S between adjacent wiring conductors, and dielectric constants $\epsilon r1$ and $\epsilon r2$ of the substrate 11 and insulating layer 13. In order to both estimate the influence of the mutual relationship of these parameters on the generation of cross-talk noise and observe the status of cross-talk noise generation, the inventor conducted experiments using the circuit shown in FIG. 3.

Figure 3:
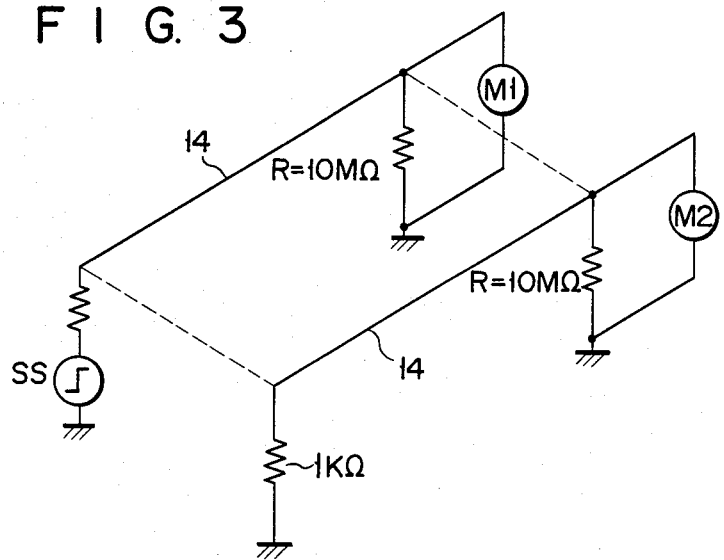
FIG. 3 is a circuit diagram showing a set-up for measuring cross-talk noise.
Figure 4:
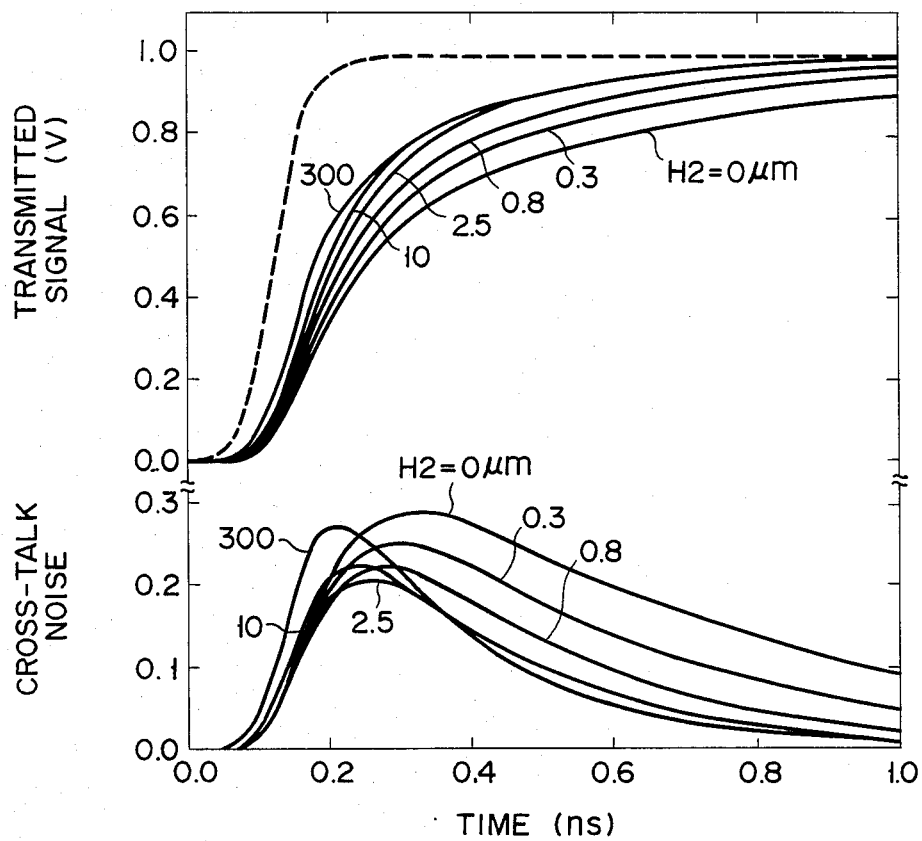
FIG. 4 is a graph showing the waveforms of cross-talk noise and a transmitted signal.

In the circuit shown in FIG. 3, two wiring conductors 14 are arranged in parallel. A signal source SS, which produces a pulse signal having a transient response of 0.1 nanosecond, is connected to the one end of one of the parallel wiring conductors 14 through a 1-KΩ resistor, while one end of the other parallel wiring conductor 14 is grounded through a 1-KΩ resistor. The opposite ends of these wiring conductors are connected to a parallel circuit of a 10-MΩ resistor and a sampling oscilloscope (M1 or M2). With this arrangement, the levels of the transmitted signal and cross-talk noise were measured. The measurement was done using a GaAs substrate with a dielectric constant of 12 as the substrate 11 and a $SiO_2$ layer with a dielectric constant of 3.8 as the insulating layer 13. The width W and distance S of the wiring conductors were set at 2 μm, and the length of the wiring was set at 3 mm. Under these conditions, the levels of the transmitted signal and cross-talk noise were measured for thicknesses H2 of the insulating layer 13 of 0, 0.3, 0.8, 2.5, 10 and 300 μm. The graph of FIG. 4 shows the results of the measurements. As is seen from the graph, the cross-talk level is 0.29 V where H2 is 0, i.e., where the insulating layer 13 is not formed on the substrate 11. On the other hand, the cross-talk level is about 0.21 V where H2 is 2.5 μm. This means that, using the insulating layer 13, the noise level is reduced by 27%. It is also found that the noise level reduction effect is improved by reducing the dielectric constant of the insulating layer 13. The graph of FIG. 5 shows this effect. The graph was obtained by setting substantially the same conditions as in the experiment of FIG. 4. The graph illustrates values of $\epsilon r1$ and $\epsilon r2$, as shown in Table 1 below.

TABLE 1

|   | $\epsilon r1$ | $\epsilon r2$ |
|---|------|------|
| a | 12   | 3.8  |
| b | 12   | 2.0  |
| c | 12   | 5.0  |
| d | 10   | 3.8  |
| e | 12   | 7.0  |
| f | 5.0  | 2.0  |
| g | 40   | 3.8  |

In the graph of FIG. 5, curve a is obtained by setting the measurement conditions shown in FIG. 4. Curve b is obtained by reducing the value of $\epsilon r2$ of curve a to 2.0. In the case of curve b, the ratio of the noise level to the transmitted signal level is reduced to 17%, i.e., 0.17 V.

The peak level of the cross-talk noise was measured under the same conditions as in FIG. 2 for various relations between the sum H1+H2 of the thicknesses of the substrate 11 and insulating layer 13, and the distance S between wiring conductors, as shown in Table 2.

TABLE 2

|   | H1 + H2 | S |
|---|---------|---|
| h | 300     | 2 |
| i | 600     | 2 |
| j | 300     | 4 |
| k | 100     | 2 |
| l | 50      | 2 |

The graph of FIG. 6 shows the results obtained for the parameters shown in Table 2. As is seen in FIG. 6, when the thickness H1 of the substrate 11 is increased, the thickness H2 of the insulating layer 13, corresponding to the minimum cross-talk noise level, is hardly changed. However, when the distance S between wiring conductors is changed, the minimum cross-talk noise level is greatly changed with a change in H2, although the sum H1 and H2 is the same (300 μm), as is seen in curves h and j.

Figure 7:
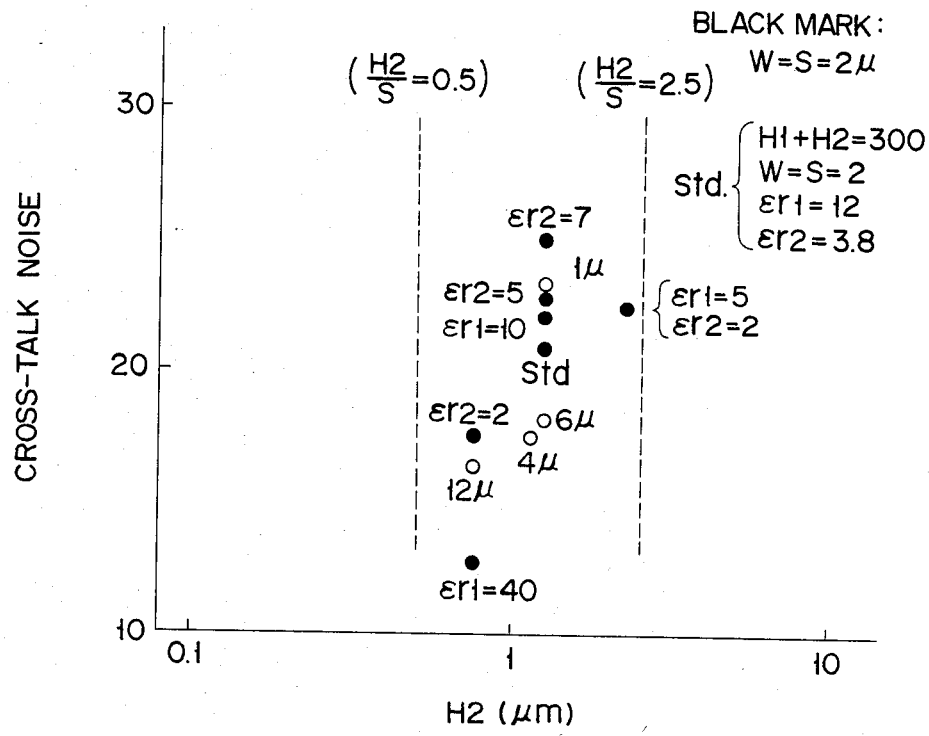
FIG. 7 is a graph showing the relation between cross-talk noise levels corresponding to various measurement conditions and dielectric layer thicknesses.

FIG. 7 is a distribution diagram showing the thickness of the insulating layer corresponding to the minimum cross-talk noise level of the curves a to g in FIGS. 5 and 6. As is obvious from this distribution diagram, the thickness H2 of the insulating layer corresponding to the minimum cross-talk noise level is concentrated in a range of 1 to 5 μm. That is, the cross-talk noise can be effectively reduced by setting the thickness H2 of the insulating layer within this range. However, as noted before, the cross-talk noise varies with the distance S between wiring conductors. Therefore, cross-talk noise can be effectively reduced by setting the ratio H2/S of the insulating layer thickness H2 to the distance S, within a predetermined range. The range of H2/S is suitably 0.5 to 2.5, as derived from the optimum thickness H2 of 1 to 5 μm in FIG. 7 when S is set at 2 μm. With the ratio H2/S set at 0.5 to 2.5, the cross-talk noise can be effectively reduced to improve the signal-to-noise ratio of the semiconductor device.

Figure 8:
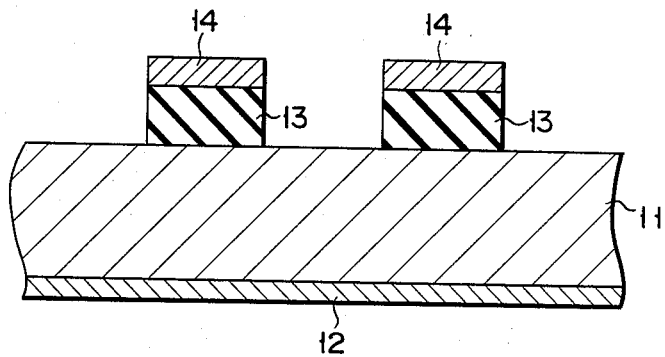
FIG. 8 is a sectional view showing a different embodiment of the circuit board according to the invention.

In the above embodiment, the insulating layer 13 has been formed over the entire principal surface of the semiconductor substrate 11. However, it is possible to form the insulating layer 13 over only those portions of the surface where the wiring conductors 14 are formed, as shown in FIG. 8. Further, while in the above embodiment the width and length of the wiring conductors have been set at 2 μm and 3 mm, respectively, these values are by no means limitative; the width and length may be set appropriately such that the ratio H2/S is 0.5 to 2.5. Further, while in the above embodiment GaAs and $SiO_2$ have been used as the materials of the substrate and insulating layer, respectively, it is possible to conceive of combining the materials to be used in the substrate and insulating layer. For example, it is possible to use sapphire, glass (SiC), etc., as well as GaAs and ceramics for the substrate, and SiN, polyimide, Teflon and other resins, as well as diamond and $SiO_2$ for the insulating layer.

The circuit board where the cross-talk noise is reduced in the manner described above is particularly effective in a GaAs-DCFL (direct-coupled FET logic) where the noise margin is particularly small, and it contributes qualitatively to the improvement of IC devices.

What is claimed is:

1. A circuit board on which an integrated circuit is fabricated, comprising:
   a substrate made of one of semi-insulating and insulating materials, and having a predetermined dielectric constant;
   an insulating layer formed on said substrate and made of an insulating material having a lower dielectric constant than the dielectric constant of said substrate; and
   a plurality of parallel wiring conductors formed at predetermined intervals on said insulating layer;
   said insulating layer having a thickness equal to 0.5 to 2.5 times the distance between adjacent wiring conductors to reduce cross-talk noise.

2. The circuit board according to claim 1, wherein said substrate is made of semi-insulating GaAs, said insulating layer is made of $SiO_2$, and said wiring conductors are metallic conductors.

3. The circuit board according to claim 1, wherein said substrate is made of alumina ceramics.

4. The circuit board according to claim 1, wherein said insulating layer is made of polyimide.

5. The circuit board according to claim 1, wherein said insulating layer is made of polytetrafluoroethylene.

6. The circuit board according to claim 1, wherein a GaAs integrated circuit is fabricated on said substrate.

7. The circuit board according to claim 6, wherein said GaAs integrated circuit is a direct-coupled field effect transistor logic circuit.

8. The circuit board according to claim 1, wherein a hybrid integrated circuit is formed on said substrate.

9. The circuit board comprising:
   a substrate made of a semi-insulating GaAs and having a predetermined dielectric constant;
   an insulating layer formed on said substrate and made of one of $SiO_2$ and SiN, which have a lower dielectric constant than the dielectric constant of said substrate; and
   a plurality of parallel wiring metallic conductors formed at predetermined intervals on said insulating layer, said insulating layer having a thickness equal to 0.5 to 1.5 times the distance between adjacent wiring conductors.

10. The circuit board according to claim 1, wherein said substrate is made of semi-insulating GaAs, said insulating layer is made of polyimide, and said wiring conductors are metallic conductors.

* * * * *